(12) United States Patent
Chiou et al.

(10) Patent No.: US 9,147,655 B2
(45) Date of Patent: Sep. 29, 2015

(54) SEMICONDUCTOR DEVICE INTEGRATING PASSIVE ELEMENTS

(71) Applicant: NATIONAL CHIAO TUNG UNIVERSITY, Hsinchu (TW)

(72) Inventors: Jin-Chern Chiou, Hsinchu (TW); Chih-Wei Chang, Taoyuan County (TW); Tzu Sen Yang, Taichung (TW)

(73) Assignee: National Chiao Tung University, Hsinchu (TW)

( * ) Notice: Subject to any disclaimer, the term of this patent is extended or adjusted under 35 U.S.C. 154(b) by 74 days.

(21) Appl. No.: 14/016,530

(22) Filed: Sep. 3, 2013

(65) Prior Publication Data
US 2014/0175607 A1    Jun. 26, 2014

(30) Foreign Application Priority Data
Dec. 25, 2012    (TW) .............................. 101149730 A

(51) Int. Cl.
| | |
|---|---|
| *H01L 29/00* | (2006.01) |
| *H01L 23/522* | (2006.01) |
| *H01L 27/01* | (2006.01) |
| *H01L 23/48* | (2006.01) |
| *H01L 49/02* | (2006.01) |

(52) U.S. Cl.
CPC .......... *H01L 23/5223* (2013.01); *H01L 27/016* (2013.01); *H01L 23/481* (2013.01); *H01L 23/5227* (2013.01); *H01L 23/5228* (2013.01); *H01L 28/20* (2013.01); *H01L 28/60* (2013.01); *H01L 2924/0002* (2013.01)

(58) Field of Classification Search
CPC . H01L 23/5223; H01L 27/016; H01L 23/481; H01L 23/5227; H01L 23/5228; H01L 28/20; H01L 28/60; H01L 2924/0002; H01L 2924/00
USPC ........................................................ 257/532
See application file for complete search history.

(56) References Cited

U.S. PATENT DOCUMENTS

| | | | | |
|---|---|---|---|---|
| 5,600,175 | A | * | 2/1997 | Orthmann ...................... 257/532 |
| 6,437,385 | B1 | * | 8/2002 | Bertin et al. .................. 257/301 |
| 6,963,483 | B2 | * | 11/2005 | Chakravorty et al. ...... 361/306.3 |

(Continued)

OTHER PUBLICATIONS

The CIC CMOS MEMS Design Platform for Heterogeneous Integration, Chip Implementation Centor (CIC), Apr. 2008.

(Continued)

*Primary Examiner* — Thanh T Nguyen
(74) *Attorney, Agent, or Firm* — Rosenberg, Klein & Lee

(57) ABSTRACT

The present invention provides a semiconductor device integrating passive elements, which applies to analog circuits, wherein capacitors, resistors and inductors are fabricated by a TVS technology. The semiconductor device comprises a substrate; at least one passive element arranged in the substrate; and at least one semiconductor integrated circuit formed in the substrate. The passive element includes a first conductive layer, a first dielectric layer and a second conductive layer, which are stacked sequentially. The first conductive layer and the second conductive layer cooperate with the first dielectric layer to form an equivalent element. The semiconductor circuit is electrically connected with the passive element through the first conductive layer and the second conductive layer to form bidirectional signal transmission paths. The passive elements can be formed on the back side of the substrate to reduce the area occupied by the passive elements in the substrate.

14 Claims, 7 Drawing Sheets

(56) References Cited

U.S. PATENT DOCUMENTS

| | | |
|---|---|---|
| 8,088,667 B2 | 1/2012 | Denatale et al. |
| 2012/0074584 A1 | 3/2012 | Lee et al. |

OTHER PUBLICATIONS

Mukherjee, T.; Fedder, G.K.; "RF-CMOS-MEMS Based Frequency-Reconfigurable Amplifiers", Custom Integrated Circuits Conference, 2009. CICC '09, IEEE, vol. No. pp. 81-84, Sep. 13-16, 2009.

Dang B.; Wright S.L.; Andry, P.; Sprogis, E.; Ketkar, S.; Tsang, C.; Polastre, R.; Knickerbocker, J.; "3D Stack with Integrated Decoupling Capacitors", Electronic Components and Technology Conference, 2009, ECTC 2009, 59th vol. No. pp. 1-5, May 26-29, 2009.

E. Song; K. Koo; M. Kim; J.S. Pak; J. Kim; "Decoupling Capacitor Stacked Chip (DSCS) in TSV-Based 3D-ICs", Electrical Performance of Electronic Packaging and Systems (EPEPS), 2011 IEEE 20th Conference on, vol. No. pp. 235-238, Oct. 23-26, 2011.

* cited by examiner

SEMICONDUCTOR DEVICE INTEGRATING PASSIVE ELEMENTS

BACKGROUND OF THE INVENTION

1. Field of the Invention

The present invention relates to a semiconductor device, particularly to a semiconductor device where passive elements are integrated by a TSV technology.

2. Description of the Related Art

With fast evolution of deep submicron technology, a single chip is normally demanded to integrate a great number of different circuits. For a submicron CMOS (Complementary Metal Oxide Semiconductor) circuit, interaction between active CMOS elements and passive elements is a critical subject in the system design of high-performance VLSI (Very Large Scale Integration) circuits.

At present, there has been an integration technology embedding passive elements in a chip containing CMOS elements to solve the problem of layout volume expansion caused by connecting CMOS circuits with external passive elements. The technology can decrease the layout area, shorten the signal transmission paths and promote the overall performance of the semiconductor device. Refer to FIGS. 1A, 1B and 1C respectively a perspective view of a conventional semiconductor device, a circuit diagram and a top view of a conventional passive element. In the conventional technology, a CMOS element 12 and a deep trench 14 are fabricated in a silicon substrate 10 to realize a high-capacitance design. An annular insulation layer 16 is formed on the inner wall of the deep trench 14. A metal layer 18 is formed inside the insulation layer 16. Thus is formed an equivalent capacitor (C). One end of the equivalent capacitor extends from the metal layer 18 and electrically connects with the CMOS element 12 through a conductive wire. The other end of the equivalent capacitor is grounded through the silicon substrate 10. The objective of fabricating the passive elements in the semiconductor device is to increase the capacitance to filter noise or overcome ground bounce. The conventional technology can indeed integrate passive elements and CMOS elements in a single chip. However, the semiconductor device fabricated by the conventional technology can only allow voltage signals to pass unidirectionally. Therefore, the semiconductor device can only apply to digital circuits. While larger resistors, larger capacitors, larger inductors, or a great number of passive elements are intended to integrate with CMOS elements 12 in a single chip, they would occupy a larger area. Further, it becomes more difficult to design CMOS elements 12 or miniaturize the chip in such a scenario. Besides, signal interference is more likely to occur in such a scenario.

Accordingly, the present invention proposes a semiconductor device integrating passive elements to overcome the abovementioned problems.

SUMMARY OF THE INVENTION

The primary objective of the present invention is to provide a semiconductor device integrating passive elements, wherein passive elements of greater capacitance, inductance or capacitance are fabricated and integrated with a semiconductor integrated circuit in a TSV (Through Silicon Via) technology, and wherein the passive elements can conduct signals bidirectionally, whereby the semiconductor device can apply to analog circuits, and whereby the semiconductor device can be miniaturized to meet the trend of slim and compact electronic products.

Another objective of the present invention is to provide a semiconductor device integrating passive elements, wherein a TSV technology is used to fabricate passive elements on the front side or the back side of a silicon substrate, whereby a great number of passive elements can be fabricated in a single semiconductor device, and whereby the layout area of the semiconductor device is reduced, and whereby signal interference is lessened, and whereby the coupling effect between the post-MEMS process and the semiconductor integrated circuit is decreased.

To achieve the abovementioned objectives, the present invention proposes a semiconductor device integrating passive elements, which applies to analog circuits, and which comprises a substrate, at least one passive element, and at least one semiconductor integrated circuit (Integrated Circuit). The passive element is formed in the substrate and includes a first conductive layer, a first dielectric layer and a second conductive layer. The first conductive layer is formed in the substrate; the first dielectric layer is formed on the first conductive layer; the second conductive layer is formed on the first dielectric layer. Thereby is formed a laminate structure. The first conductive layer and the second conductive layer cooperate with the first dielectric layer to form an equivalent element. The semiconductor circuit is formed in the substrate and electrically connected with the passive element through the first conductive layer and the second conductive layer to form bidirectional signal transmission paths.

Below, embodiments are described in detail to make easily understood the objectives, technical contents, characteristics and accomplishments of the present invention.

DETAILED DESCRIPTION OF THE INVENTION

The present invention is mainly to design a semiconductor device applicable to analog circuits. Many analog circuits, especially biomedical analog circuits, need high-capacity passive elements, such as high-capacitance capacitors, high-resistance resistors, and high-inductance inductors. These passive elements would occupy a lot of area and thus increase the cost and volume of a circuit system. Accordingly, the present invention uses a TSV technology to fabricate passive elements having bidirectional voltage signal transmission paths, integrate the passive elements with semiconductor integrated circuit, and miniaturize the semiconductor device.

Figure 1A:
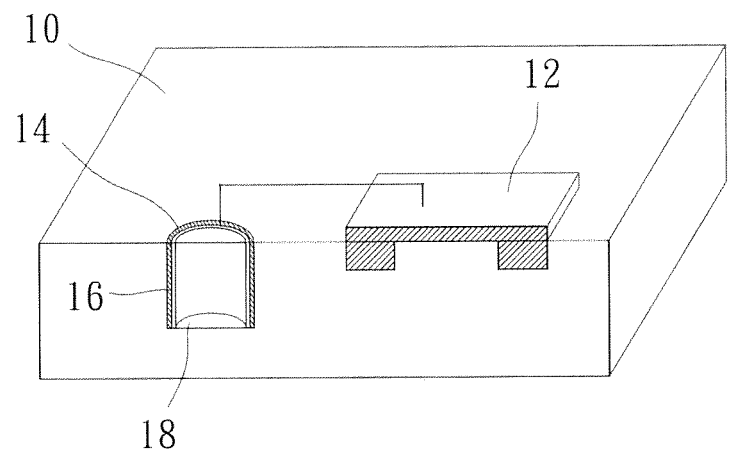
FIG. 1A is a perspective view schematically showing a conventional semiconductor device.
Figure 1B:
FIG. 1B is a circuit diagram of the conventional passive element in FIG. 1A.
Figure 1C:
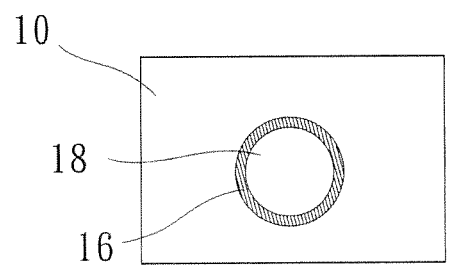
FIG. 1C is a top view schematically showing the conventional passive element in FIG. 1A.
Figure 2A:
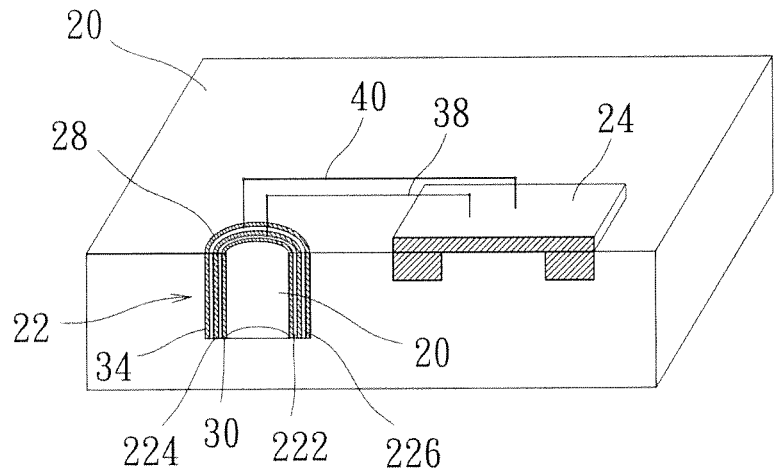
FIG. 2A is a perspective view schematically showing of the structure of a semiconductor device according to a first embodiment of the present invention.
Figure 2B:
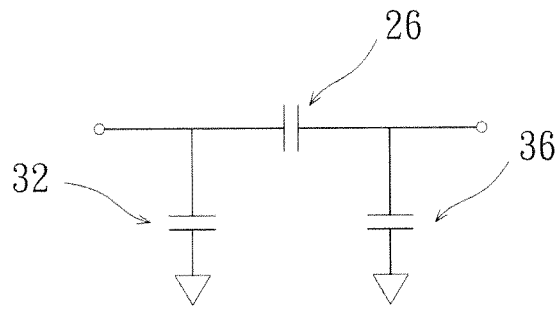
FIG. 2B is a circuit diagram of the passive element in FIG. 2A.
Figure 2C:
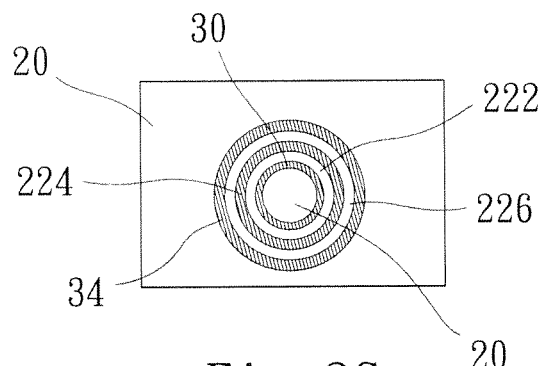
FIG. 2C is a top view schematically showing the passive element in FIG. 2A.

Refer to FIGS. 2A, 2B and 2C respectively a perspective view of the structure of a semiconductor device, a circuit diagram and a top view of a passive element according to a first embodiment of the present invention. The semiconductor device of the present invention comprises a substrate 20, at lest one passive element 22 and at least one semiconductor integrated circuit 24. The passive element 22 is formed in the substrate 20. The passive element 22 includes a first conductive layer 222, a first dielectric layer 224 and a second conductive layer 226. The first conductive layer 222 is formed in the substrate 20; the first dielectric layer 224 is formed on the first layer 222; the second conductive layer 226 is formed on the first dielectric layer 224. Thus is formed a laminate structure. The first conductive layer 222 and the second conductive layer 226 cooperate with the first dielectric layer 224 to form an equivalent element 26. Depending on the dielectric material of the first dielectric layer 224 and the material of the substrate 20, the equivalent element will function as a capacitor, a resistor or an inductor. The substrate 20 is preferably made of silicon.

In the first embodiment, the present invention is exemplified by the semiconductor device with the passive element 22 and the semiconductor integrated circuit 24 formed on the front side of the substrate 20. In the first embodiment, at least one first annular hole 28 is formed on the front side of the substrate 20 by a TSV technology, and a semiconductor integrated circuit 24 is also formed on the front side. If the passive element 22 is in a pillar shape, the passive element includes a first conductive layer 222, a first dielectric layer 224 and a second conductive layer 226, which are annularly arranged from the interior to the exterior, wherein the first conductive layer 222 and the second conductive layer 226 are annular conductive layers and the first dielectric layer 224 has a shape matching the shape of the annular conductive layers.

Before the passive element is formed inside the first annular hole 28, a second dielectric layer 30 is annularly formed inside the first annular hole 28. After the passive element has been formed inside the first annular hole 28, the second dielectric layer 30 is interposed between the first conductive layer 222 and the substrate 20, whereby a first parasitic capacitor 32 is created. Further, a third dielectric layer 34 is annularly formed between the second conductive layer 226 and the substrate 20, whereby a second parasitic capacitor 36 is created. Thus, two ends of the equivalent element 26 are respectively connected with the first conductive layer 222 and the second conductive layer 226; two ends of the first parasitic capacitor 32 are respectively connected with the first conductive layer 222 and grounded through the substrate 20; two ends of the second parasitic capacitor 36 are respectively connected with the second conductive layer 226 and grounded through the substrate 20. Thus, two ends of the equivalent element 26 function as two voltage signal terminals, using the first conductive layer 222 and the second conductive layer 226. Then, a first conductive wire 38 and a second conductive wire 40 respectively electrically connect the first conductive layer 222 and the second conductive layer 226 to the semiconductor integrated circuit 24 to form bidirectional signal transmission paths.

Figure 3A:
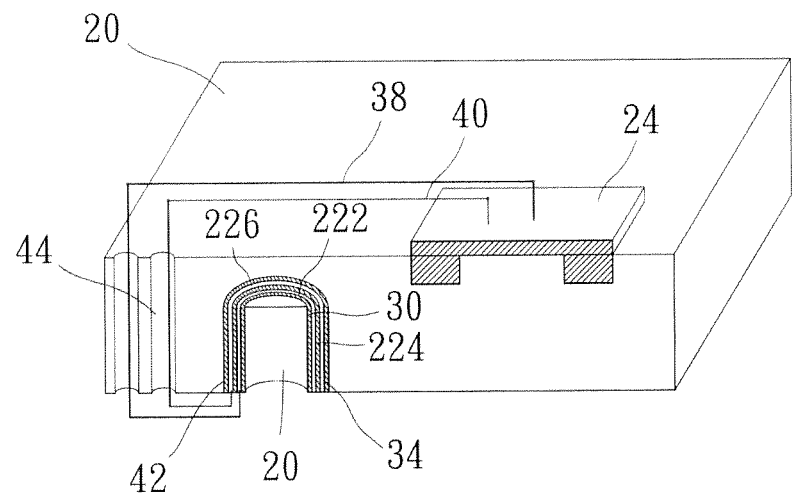
FIG. 3A is a perspective view schematically showing of the structure of a semiconductor device according to a second embodiment of the present invention.
Figure 3B:
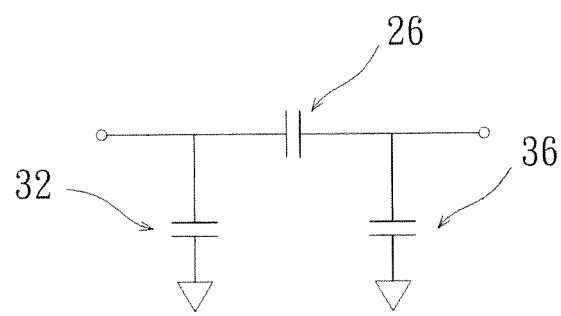
FIG. 3B is a circuit diagram of the passive element in FIG. 3A.

Alternatively, the passive element 22 and the semiconductor integrated circuit 24 may be respectively formed on different sides of the substrate 20 to reduce the area occupied by the semiconductor device in addition to that they are both formed on the front side of the substrate 20. Refer to FIG. 3A and FIG. 3B respectively a perspective view of the structure of a semiconductor device and a circuit diagram of a passive element according to a second embodiment of the present invention. In the second embodiment, at least one second annular hole 42 and at least one first via 44 are formed on the back side of the substrate 20 by a TSV technology, and a semiconductor integrated circuit 24 is formed on the front side. The passive element 22 is formed inside the second annular hole 42.

In the second embodiment, a second dielectric layer 30 is annularly formed inside the second annular hole 42 and arranged between the substrate 30 and the first conductive layer 222, whereby is created a first parasitic capacitor 32; a third dielectric layer 34 is annularly formed between the second conductive 226 and the substrate 20, whereby is created a second parasitic capacitor 36. The connection relationship of the first parasitic capacitor 32 and the second parasitic capacitor 36 is the same as that of the first embodiment and will not repeat herein. It should be noted: the passive element is formed on the back side of the substrate 20. Therefore, the first vias 44 are fabricated by a TSV technology, vertically penetrating the substrate 20 from the back side to the front side, and a first conductive wire 38 and a second conductive wire 40 are passed through the first vias 44 to respectively electrically connect the first conductive layer 222 and the second conductive layer 226 to the semiconductor integrated circuit 24. Thereby is effectively reduced the area occupied by the passive element.

Figure 4A:
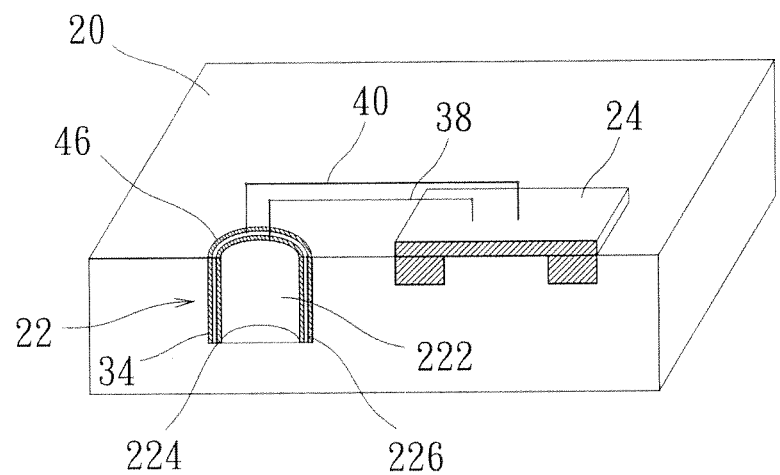
FIG. 4A is a perspective view schematically showing of the structure of a semiconductor device according to a third embodiment of the present invention.
Figure 4B:
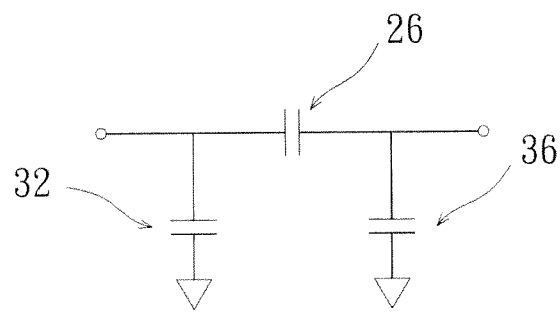
FIG. 4B is a circuit diagram of the passive element in FIG. 4A.
Figure 4C:
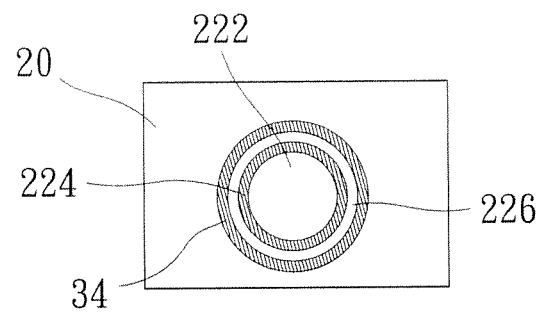
FIG. 4C is a top view schematically showing the passive element in FIG. 4A.

Refer to FIGS. 4A, 4B and 4C respectively a perspective view of the structure of a semiconductor device, a circuit diagram and a top view of a passive element according to a third embodiment of the present invention. In the third embodiment, at least one first hole 46 is formed on the front side of the substrate 20 by a TSV technology, and a semiconductor integrated circuit 24 is also formed on the front side. The passive element is formed inside the first hole 46 and includes a first conductive layer 222, a first dielectric layer 224 and a second conductive layer 226, which are annularly arranged from the interior to the exterior, wherein the first conductive layer 222 is a solid cylindrical conductive layer, the second conductive layer 226 is an annular conductive layer, and the dielectric layer 224 is fabricated to have a shape matching the shape of the annular conductive layer. A third dielectric layer 34 is annularly formed between the substrate 20 and the second conductive layer 226, whereby is created a second parasitic capacitor 36. The first conductive layer 222 and the second conductive layer 226 cooperate with the first dielectric layer 224 to form an equivalent element 26. Two ends of the equivalent element 26 are respectively connected with the first conductive layer 222 and grounded through the substrate 20, functioning as two voltage signal terminals. Two ends of the second parasitic capacitor 36 are respectively connected with the second conductive layer 226 and grounded through the substrate 20. A first conductive wire 38 and a second conductive wire 40 respectively electrically connect the first conductive layer 222 and the second conductive layer 226 to the semiconductor integrated circuit 24.

Figure 5A:
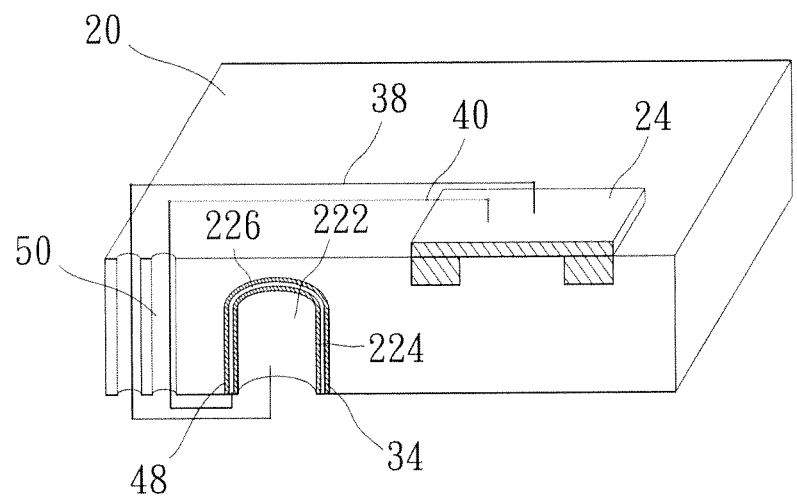
FIG. 5A is a perspective view schematically showing of the structure of a semiconductor device according to a fourth embodiment of the present invention.
Figure 5B:
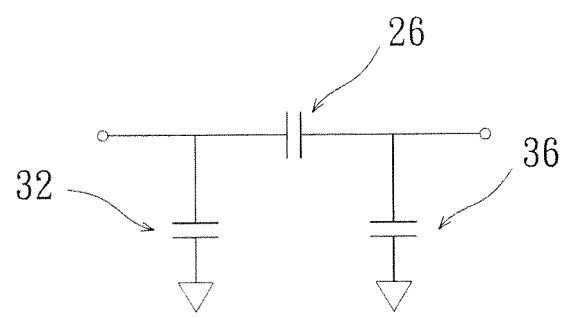
FIG. 5B is a circuit diagram of the passive element in FIG. 5A.

Refer to FIG. 5A and FIG. 5B respectively a perspective view of the structure of a semiconductor device and a circuit diagram and of a passive element according to a fourth embodiment of the present invention. The fourth embodiment is different from the third embodiment in that the passive element and the semiconductor integrated circuit 24 are respectively formed on the back side and front side of the substrate 20. At least one second hole 48 and at least one second via 50 are formed on the back side of the substrate 20 by a TSV technology. The semiconductor integrated circuit 24 is formed on the front side of the substrate 20. The passive element is formed inside the second hole 48. It should be noted: the passive element is formed on the back side of the substrate 20. Therefore, the second vias 50 are fabricated by a TSV technology, vertically penetrating the substrate 20 from the back side to the front side, and a first conductive wire 38 and a second conductive wire 40 are passed through the second vias 50 to respectively electrically connect the first conductive layer 222 and the second conductive layer 226 to the semiconductor integrated circuit 24. The first conductive layer 222 and the second conductive layer 226 cooperate with the first dielectric layer 224 to form an equivalent element 26. Two ends of the equivalent element 26 are respectively connected with the first conductive layer 222 and grounded through the substrate 20, functioning as two voltage signal terminals. Two ends of the second parasitic capacitor 36 are respectively connected with the second conductive layer 226 and grounded through the substrate 20.

Figure 6A:
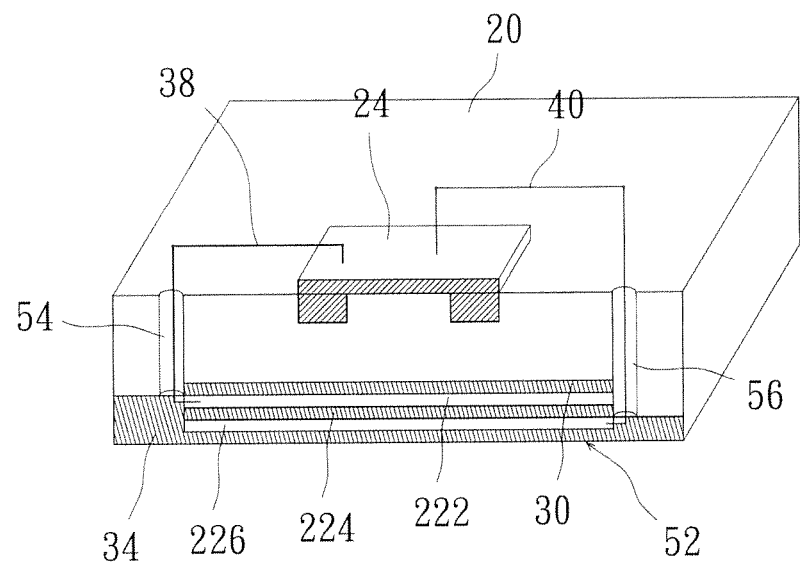
FIG. 6A is a perspective view schematically showing of the structure of a semiconductor device according to a fifth embodiment of the present invention.
Figure 6B:
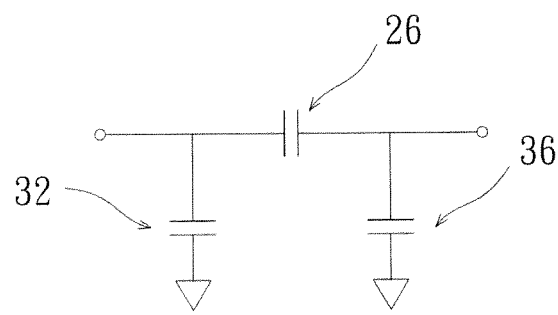
FIG. 6B is a circuit diagram of the passive element in FIG. 6A.

Refer to FIG. 6A and FIG. 6B respectively a perspective view of the structure of a semiconductor device and a circuit diagram of a passive element according to a fifth embodiment of the present invention. In the fifth embodiment, the passive element and the semiconductor integrated circuit are respectively formed on the back side and the front side of the substrate 20. In the fifth embodiment, the passive element is designed to be a laminate passive element including a first conductive layer 222, a first dielectric layer 224 and a second conductive layer 226, which are arranged from bottom to top of a trench sequentially. At least one trench 52, at least one third via 54 and at least one fourth via 56 are formed on the back side of the substrate 20. The present invention uses a post-MEMS process to fabricate the laminate passive element and sequentially form the first conductive layer 222, the first dielectric layer 224 and the second conductive layer 226 inside the trench 52 from bottom to top. A second dielectric layer 30 is formed inside the trench 52 and between the substrate 20 and the first conductive layer 222, whereby is created a first parasitic capacitor 32. A third dielectric layer 34 is formed between the substrate 20 and the second conductive layer 226, whereby is created a second parasitic capacitor 36. The first dielectric layer 224 is made of a high-K dielectric material, whereby the first conductive layer 222 and the second conductive layer 226 cooperate with the first dielectric layer 224 to form an equivalent element 26, such as a high-capacitance capacitor, a high-resistance resistor or a high-inductance inductor. A first conductive wire 38 and a second conductive wire 40 are respectively passed through the third via 54 and the fourth via 56 to electrically connect the first conductive layer 222 and the second conductive layer 226 to the semiconductor integrated circuit 24. In addition to the I-shape laminate passive element, the post-MEMS process can also fabricate a crooked M-shape laminate passive element, an O-shape laminate passive element, or a square laminate passive element.

In the abovementioned embodiments, the semiconductor integrated circuit 24 is a CMOS transistor, and the passive element is a resistor, a capacitor or an inductor.

The first dielectric layer 224 is made of an insulation material selected from a group consisting of tantalum pentoxide ($Ta_2O_5$), titanium dioxide ($TiO_2$), hafnium oxide ($HfO_2$), zirconium dioxide ($ZrO_2$), aluminum oxide ($Al_2O_3$), lanthanum oxide ($La_2O_3$), and praseodymium trioxide ($Pr_2O_3$). Suppose that the passive element is to be fabricated into a high-resistance resistor. If the dielectric layer, which is between the first conductive layer 222 and the second conductive layer 226, is made of a material having high resistance and low dielectricity, the passive element will be a high-impedance resistor. Similarly, in the case of fabricating a capacitor or an inductor, appropriate materials are selected according to the requirement and characteristics of the circuit to fabricate a high-capacitance or high-inductance passive element. Similarly, the capacitance of the first parasitic capacitor 32 or the second parasitic capacitor 36 is also dependent on the selected dielectric material.

Figure 7:
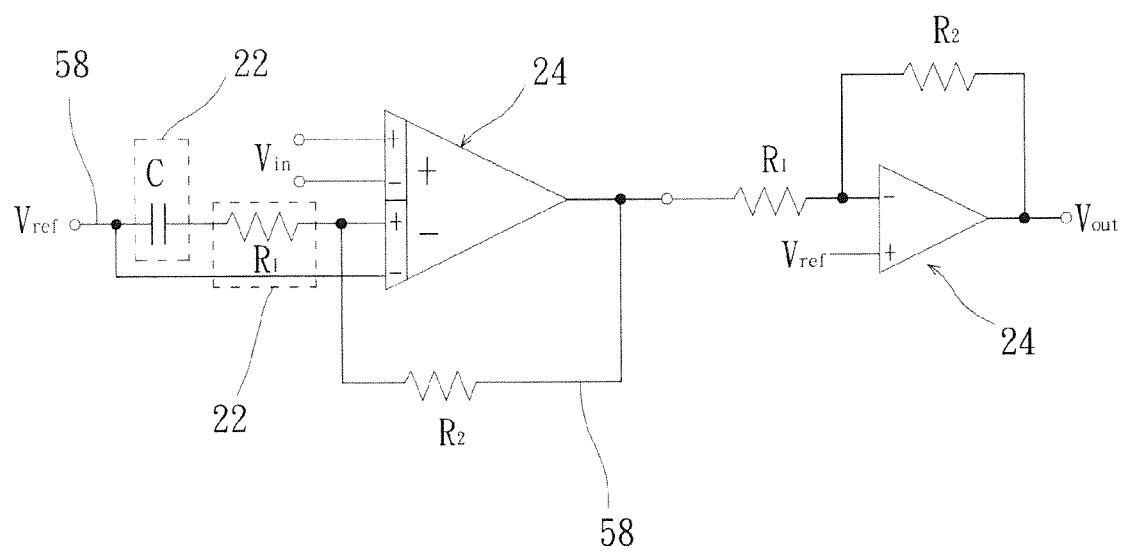
FIG. 7 is a diagram schematically showing an application of a semiconductor device to an analog circuit according to the present invention.

Refer to FIG. 7 a diagram schematically showing an application of a semiconductor device to an analog circuit according to the present invention. In one embodiment of the present invention, a plurality of passive elements 22 and semiconductor integrated circuit 24 is fabricated in a substrate. In one embodiment, the semiconductor integrated circuit 24 are formed on the front side of the substrate, and the passive elements 22 are formed on the front side or the back side. In one embodiment, the passive elements 22 are formed on both the front side and the back side. The passive elements 22 are connected in series or parallel and connected to the corresponding semiconductor integrated circuit 24 by at least two conductive wires 58 respectively joined with two ends of each passive element 22 (i.e. the first conductive layer and the second conductive layer of the passive element). As the structural design of the passive elements of the present invention supports bidirectional signal transmission, the semiconductor device of the present invention is applicable to analog circuits. Therefore, the present invention can overcome the conventional difficulty of integrating passive elements and can break through the conventional limitation that the semiconductor device integrating passive elements can only apply to digital circuits. The semiconductor device of the present invention is not only applied to analog circuits of amplifiers but also applied to the analog circuits of switches, power supplies, etc.

In conclusion, the present invention fabricates two conductive layers in a substrate by a TSV technology to enable the equivalent element between the two conductive layers to support bidirectional signal transmission. Thereby, the present invention can reduce the layout area of circuits, increase integration density, decrease mutual interference between signals, promote the overall performance of the circuit system, and miniature the semiconductor device to meet the trend of slim and compact electronic products. Further, the present invention can effectively integrate passive elements (such as resistors, capacitors and inductors) with semiconductor integrated circuit, overcome the problem that passive elements occupy too much area of the substrate, and decrease the coupling effect between the post-MEMS process and the CMOS circuits, without using any special fabrication process.

The embodiments described above are only to exemplify the present invention but not to limit the scope of the present invention. Any equivalent modification or variation according to the characteristic or spirit of the present invention is to be also included within the scope of the present invention.

What is claimed is:

1. A semiconductor device integrating passive elements, applying to analog circuits and comprising
a substrate;
at least one passive element arranged in said substrate and including
a first conductive layer formed in said substrate;
a first dielectric layer formed on said first conductive layer; and
a second conductive layer formed on said first dielectric layer, wherein said first conductive layer and said second conductive layer cooperate with said first dielectric layer to form an equivalent element; and
at least one semiconductor integrated circuit (Integrated Circuit) formed in said substrate and electrically connected with said first conductive layer and said second conductive layer to form bidirectional signal transmission paths, and said first conductive layer, said first dielectric layer and said second conductive layer are annularly arranged from interior to exterior, and wherein said first conductive layer and said second conductive layer are annular conductive layers, and wherein said first dielectric layer has a shape matching said annular conductive layers, and at least one second annular hole and at least one first via are formed on a back side of said substrate by a Through Silicon Via (TSV) technology, and wherein said semiconductor integrated circuit is formed on a front side of said substrate, and wherein said passive element is arranged inside said second annular hole, and wherein a first conductive wire and a second conductive wire are respectively passed through said first vias to electrically connect said first conductive layer and said second conductive layer to said semiconductor IC.

2. The semiconductor device integrating passive elements according to claim 1, wherein at least one first annular hole is formed on a front side of said substrate, and wherein said semiconductor integrated circuit is formed on said front side of said substrate, and wherein said passive element is arranged inside said first annular hole, and wherein a first conductive wire and a second conductive wire respectively electrically connect said first conductive layer and said second conductive layer to said semiconductor IC.

3. The semiconductor device integrating passive elements according to claim 2, wherein a second dielectric layer is annularly arranged inside said first annular hole and between said substrate and said first conductive layer to create a first parasitic capacitor, and wherein a third dielectric layer is annularly arranged between said substrate and said second conductive layer to create a second parasitic capacitor.

4. The semiconductor device integrating passive elements according to claim 1, wherein a second dielectric layer is annularly arranged inside said second annular hole and between said substrate and said first conductive layer to create a first parasitic capacitor, and wherein a third dielectric layer is annularly arranged between said substrate and said second conductive layer to create a second parasitic capacitor.

5. The semiconductor device integrating passive elements according to claim 1, wherein at least one first hole is formed on a front side of said substrate, and wherein said semiconductor integrated circuit is formed on said front side of said substrate, and wherein said passive element is arranged inside said first hole, and wherein a first conductive wire and a second conductive wire respectively electrically connect said first conductive layer and said second conductive layer to said semiconductor IC.

6. The semiconductor device integrating passive elements according to claim 5, wherein a third dielectric layer is formed between said substrate and said second conductive layer to create a second parasitic capacitor.

7. The semiconductor device integrating passive elements according to claim 1, wherein said laminate passive element includes said first conductive layer, said first dielectric layer and said second conductive layer, which are arranged from bottom to top sequentially.

8. The semiconductor device integrating passive elements according to claim 7, wherein at least one trench, at least one third via and at least one fourth via are formed on a back side of said substrate, and wherein said semiconductor integrated circuit is formed on a front side of substrate, and wherein said first conductive layer, said first dielectric layer and said second conductive layer are arranged inside said trench from bottom to top sequentially, and wherein a first conductive wire and a second conductive wire are respectively passed through said third via and said fourth via to electrically connect said first conductive layer and said second conductive layer to said semiconductor IC.

9. The semiconductor device integrating passive elements according to claim 8, wherein a second dielectric layer is formed inside said trench and between said substrate and said first conductive to create a first parasitic capacitor, and wherein a third dielectric layer is formed between said substrate and said second conductive layer to create a second parasitic capacitor.

10. The semiconductor device integrating passive elements according to claim 1, wherein said passive element is a resistor, a capacitor or an inductor.

11. The semiconductor device integrating passive elements according to claim 1, wherein said first dielectric layer is made of a material selected from a group consisting of tantalum pentoxide ($Ta_2O_5$), titanium dioxide ($TiO_2$), hafnium oxide ($HfO_2$), zirconium dioxide ($ZrO_2$), aluminum oxide ($Al_2O_3$), lanthanum oxide ($La_2O_3$), and praseodymium trioxide ($Pr_2O_3$).

12. The semiconductor device integrating passive elements according to claim 1, wherein said semiconductor integrated circuit is a CMOS (Complementary Metal Oxide Semiconductor) transistor.

13. A semiconductor device integrating passive elements, applying to analog circuits and comprising
a substrate;
at least one passive element arranged in said substrate and including
a first conductive layer formed in said substrate;
a first dielectric layer formed on said first conductive layer; and
a second conductive layer formed on said dielectric layer, wherein said first conductive layer and said second conductive layer cooperate with said first dielectric layer to form an equivalent element; and
at least one semiconductor integrated circuit (Integrated Circuit) formed in said substrate and electrically connected with said first conductive layer and said second conductive layer to form bidirectional signal transmission paths, and said first conductive layer, said first dielectric layer and said second dielectric layer are annularly arranged from interior to exterior, and wherein said first conductive layer is a solid cylindrical conductive layer, and wherein said second conductive layer is an annular conductive layer, and wherein said first dielectric layer has a shape matching said annular conductive layer, and at least one second hole and at least one second via are formed on a back side of said substrate by a Through Silicon Via (TSV) technology, and wherein said semiconductor integrated circuit is formed on a front side of said substrate, and wherein said passive element is arranged inside said second hole, and wherein a first conductive wire and a second conductive wire are respectively passed through said second via to electrically connect said first conductive layer and said second conductive layer to said semiconductor IC.

14. The semiconductor device integrating passive elements according to claim 13, wherein a third dielectric layer is formed between said substrate and said second conductive layer to create a second parasitic capacitor.

* * * * *